(12) United States Patent
Klootwijk et al.

(10) Patent No.: US 7,704,881 B2
(45) Date of Patent: Apr. 27, 2010

(54) PRODUCING A COVERED THROUGH SUBSTRATE VIA USING A TEMPORARY CAP LAYER

(75) Inventors: Johan H. Klootwijk, Eindhoven (NL); Antonius L. A. M. Kemmeren, Breda (NL); Ronald Dekker, Valkenswaard (NL); Eric Cornelis Egbertus Van Grunsven, Someren (NL); Freddy Roozeboom, Waalre (NL)

(73) Assignee: NXP B.V., Eindhoven (NL)

( * ) Notice: Subject to any disclaimer, the term of this patent is extended or adjusted under 35 U.S.C. 154(b) by 75 days.

(21) Appl. No.: 12/092,605

(22) PCT Filed: Nov. 3, 2006

(86) PCT No.: PCT/IB2006/054082
§ 371 (c)(1),
(2), (4) Date: May 5, 2008

(87) PCT Pub. No.: WO2007/054867
PCT Pub. Date: May 18, 2007

(65) Prior Publication Data
US 2008/0280435 A1 Nov. 13, 2008

(30) Foreign Application Priority Data
Nov. 8, 2005 (EP) .................................. 05110466

(51) Int. Cl.
H01L 21/44 (2006.01)
(52) U.S. Cl. ....................................... 438/667; 257/773

(58) Field of Classification Search ....................... None
See application file for complete search history.

(56) References Cited

U.S. PATENT DOCUMENTS
6,429,509 B1 8/2002 Hsuan
(Continued)

FOREIGN PATENT DOCUMENTS
EP 666595 A1 8/1995
(Continued)

Primary Examiner—Ha Tran T Nguyen
Assistant Examiner—Shantanu C Pathak

(57) ABSTRACT

The present invention relates to a method for producing a substrate with at least one covered via that electrically and preferably also thermally connects a first substrate side with an opposite second substrate side. The processing involves forming a trench on a the first substrate side remains and covering the trench with a permanent layer on top of a temporary, sacrificial cap-layer, which is decomposed in a thermal process step. The method of the invention provides alternative ways to remove decomposition products of the sacrificial cap-layer material without remaining traces or contamination even in the presence of the permanent layer. This is, according to a first aspect of the invention, achieved by providing the substrate trench with an overcoat layer that has holes. The holes in the overcoat layer leave room for the removal of the decomposition products of the cap-layer material. According to the second aspect of the invention, opening the covered trench from the second substrate side and allowing the cap-layer material to be removed through that opening provides a solution. Both methods of the present invention are based on the common idea of using a temporary cap-layer even in a situation where the substrate opening is permanently covered before the removal of the temporary cap-layer.

26 Claims, 7 Drawing Sheets

U.S. PATENT DOCUMENTS

Figure 1:
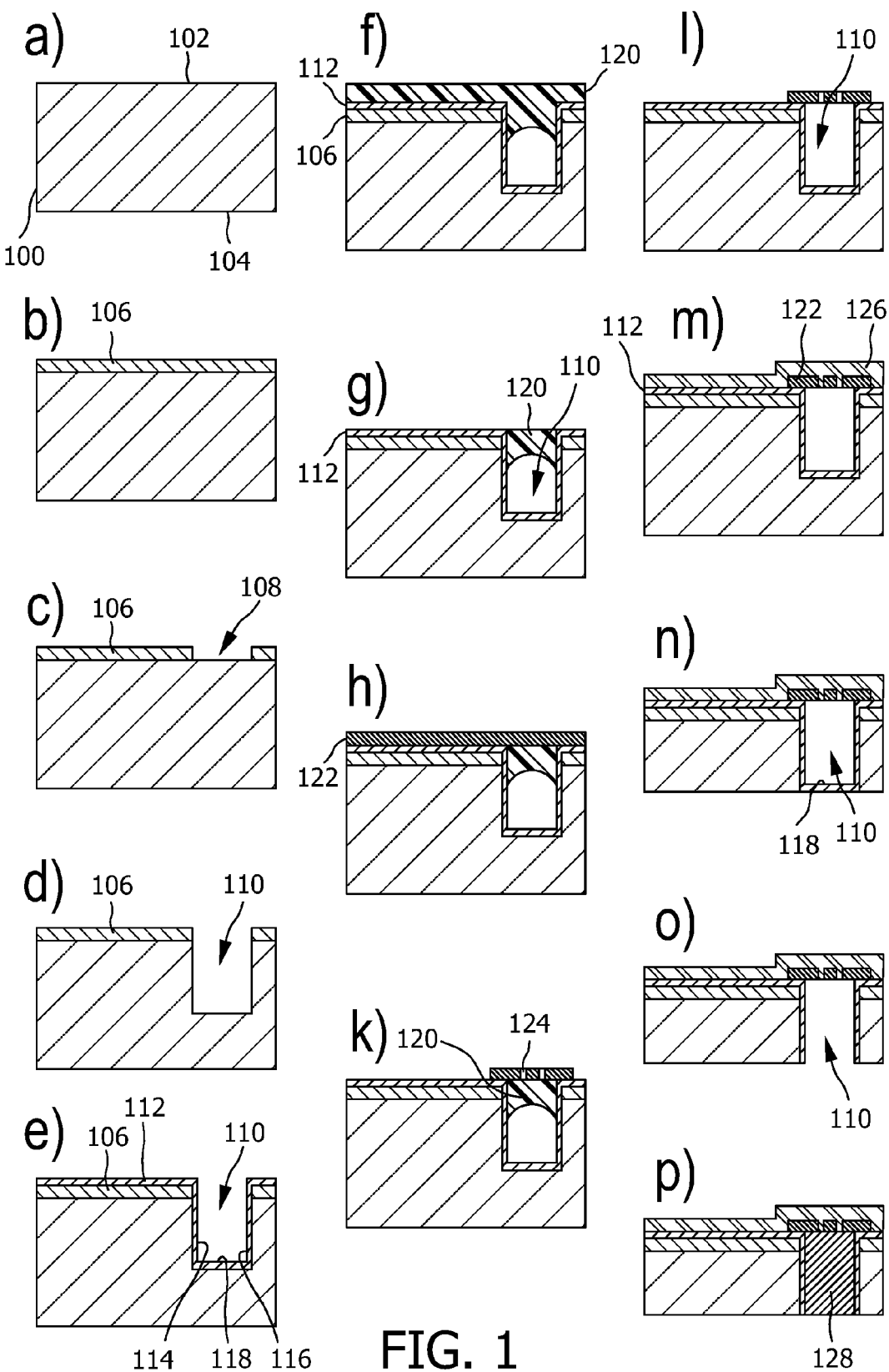

| | | | |
|---|---|---|---|
| 6,440,846 B1 | 8/2002 | Ikeya | |
| 6,833,320 B2 * | 12/2004 | Meagley et al. | 438/640 |
| 2005/0046002 A1 * | 3/2005 | Lee et al. | 257/678 |
| 2005/0059217 A1 * | 3/2005 | Morrow et al. | 438/455 |

FOREIGN PATENT DOCUMENTS

| | | |
|---|---|---|
| JP | 09092675 A | 4/1997 |
| WO | 2004114397 A1 | 12/2004 |
| WO | WO 2004114397 A1 * | 12/2004 |

* cited by examiner

PRODUCING A COVERED THROUGH SUBSTRATE VIA USING A TEMPORARY CAP LAYER

The present invention relates to a method for producing a substrate with a via that electrically connects a first substrate side with an opposite second substrate side.

Traditional integrated circuits (ICs) were implemented with a single die assembled in a plastic package. To meet system requirements, product developers completed the functionality with the addition of other ICs, mother board circuitry, passive components, etc.

Demands in the semiconductor industry for higher levels of (heterogeneous) integration, lower costs, and a growing awareness of complete system configuration have driven the development of System in Package (SiP) solutions. A SiP may contain one or more integrated-circuit (IC) chips in a wirebonded or "flip-chip" configuration. Existing market uses for SiP include in particular radio-frequency (RF) and other wireless devices.

Concepts of System-in-Package (SiP) modules focus on the provision of through-substrate vias. WO2004/114397 describes a method for concurrent formation of trench capacitors on the first side of a substrate and of a vertical interconnect between the first and the second sides of the substrate. The method involves the formation of trenches for the interconnect. Some of the trenches are opened by removing substrate material from the second substrate side to form through-substrate holes. Then, the inner faces of the holes are covered with a dielectric layer. Finally, the through-substrate hole is filled with a conductive material to form the through-substrate via.

A problem in the processing of a through-substrate via is constituted by the mere fact that it involves the formation of a through-hole in the substrate. After formation of the hole, all material deposited on either side of the substrate can sag into the hole. If the through-substrate via is made starting from a trench that is subsequently opened on the substrate back-side, then any material deposited wet-chemically may contaminate the trench and thus the completed via, as a consequence of capillary action. These problems complicate or obstruct subsequent processing steps. In particular, the provision of a layer covering the hole, such as a plating base on the first substrate side, is affected by this problem.

U.S. Pat. No. 6,429,509B1 discloses a semiconductor die that is configured for connecting to a second semiconductor die. While the circuits on the die are arranged on a first substrate side, an interconnect to the second die is arranged on a second substrate side of the die. A through-substrate via connects the first side with the second side. The via is formed by drilling and subsequent filling with $SiO_2$, prior to the manufacturing of circuits and interconnect layers on the top side of the die. Later on, the oxide filling of the vias is selectively etched out of the vias, and a conductive filling of the vias is provided. The method of U.S. Pat. No. 6,429,509B1 requires an etching step for removing $SiO_2$ from the via. This involves rather complicated processing and is thus costly.

EP666595 discloses a semiconductor substrate with a plurality of insulated through-substrate vias. The through-holes have been made by wet-etching and are filled with electrically conductive material, for instance with chemical vapour deposition and subsequent planarisation with etching or chemical-mechanical polishing. They could also be made by plating on an additional substrate. Bond pads are provided on the through-substrate vias, wherein one bond pad is coupled to a plurality of vias. No electrical elements are present in the substrate; the substrate is merely a connection element between circuits attached on at least one thereof.

JP09-092675 discloses a process for manufacturing through-substrate vias. In this process, the substrate and trenches are made, after which an insulator and the electrically conductive material is provided in the trenches. The provision of electrically conductive material can be effected prior to or after the opening of the trenches from the second side. Elements such as transistors have been defined in the substrate prior to the manufacturing the through-substrate vias. A metallisation is applied on the vias, thereafter. The metallisation includes bond pads on the vias.

It is however a major disadvantage of this known process that the stress is provided on the substrate, potentially leading to cracks. This is particularly the case, if the via is filled with a metal or alloy instead of with polysilicon. Metal is however preferred above polysilicon, as the resistance of polysilicon is too high for signal transmission, particularly in RF applications. Additionally, the thermal resistance of polysilicon is less good than that of metals. The processing on the substrate involves for instance the deposition of passivation layers, such as silicon nitride, with PECVD. This is carried out by temperatures about 300° C. For oxide layers that are deposited by PECVD and for LPCVD the needed temperatures are even higher. In such treatments the metal in the through-substrate via expands more than the silicon substrate, leading to the stress.

It is therefore an object of the present invention to provide a method for producing a substrate with a covered through-substrate via that electrically connects a first substrate side with an opposite second substrate side, which allows the provision of layers, such as passivation layers, on the substrate.

For reasons of clarity, the method aspect of the present invention will be explained first in the following.

According to a first aspect of the invention, a method for producing a substrate with at least one covered through-substrate via that electrically connects a first substrate side with an opposite second substrate side is provided. The method comprises the steps of A method for producing a semiconductor substrate with at least one covered through-substrate via that electrically connects a first substrate side with an opposite second substrate side, comprising the steps of:

producing a substrate trench on the first substrate side at a predetermined position of the via;

applying a sacrificial cap layer consisting of a cap-layer material, which is thermally stable below a threshold temperature and decomposes at temperatures higher than the threshold temperature, on the first side of the substrate in a patterned manner, thereby completely covering and either partially or completely filling the substrate trench with the cap-layer material, and providing, at a temperature below the threshold temperature, an overcoat layer that covers the sacrificial cap layer on the substrate trench;

opening the substrate trench from the second substrate side to transform the trench into a through-substrate via hole;

letting the sacrificial cap layer decompose at a temperature above the threshold temperature and removing all decomposition products of the sacrificial cap layer, and applying electrically conductive material in the substrate trench from the second side so as to provide a through-substrate that extends to the second substrate side.

In the method of the first aspect of the invention, the production of a covered via in a substrate is made possible by use of a sacrificial cap layer that is deposited on the first side of the substrate. The cap-layer material temporarily covers a substrate trench at the desired position of the via, formed in an earlier processing step. In practice, the cap-layer material will not only cover the opening formed by the substrate trench on the first substrate side, but also partially or completely fill the substrate trench.

The sacrificial cap layer thus provides a flat substrate surface for further layer deposition to produce a covering of the via, and other processing steps on the first substrate side, which are to be performed while the trench or via is still empty. If the trench or via is still empty, then the processing steps requiring higher temperature do not lead to stress and cracks as a consequence of difference in expansion between the semiconductor substrate and the conductive material in the via.

According to the present invention, the cap-layer material is selected to be thermally stable below a threshold temperature, and to decompose at temperatures higher than the threshold temperature. This way, the sacrificial cap layer can be kept as long as needed. To this end, processing is performed at temperatures below the threshold temperature as long as the cap layer is required. As soon as the cap layer is dispensable for further processing, it can be decomposed by increasing the temperature above the threshold temperature.

Suitable cap-layer materials per se are known in the art. Several examples will be given below in the context of the description of preferred embodiments of the invention.

U.S. Pat. No. 6,833,320 B2, which is incorporated herein in its entirety by reference, discloses the use of such thermally decomposable sacrificial materials for temporarily filling a first opening in a dielectric layer on a substrate. In U.S. Pat. No. 6,833,320 B2, a sacrificial material is used to provide a substantially flat substrate surface, free of openings, in a further trench lithography and etching process for forming a second opening. The sacrificial material is removed by heating the substrate before filling the first and second openings. However, U.S. Pat. No. 6,833,320 B2 does not teach how to remove the decomposition product of the temporary filling in a situation underlying the object of the present invention, where the opening in the substrate is covered with a permanent cover layer before the decomposition step.

In contrast thereto, the method of the invention provides alternate ways to remove the decomposition products of the cap-layer material without remaining traces or contamination while the trench on the first substrate side remains covered with a permanent cover layer. This is, according to a first alternative comprised by the method of the invention, achieved by providing the substrate trench with an overcoat layer that has holes. The holes in the overcoat layer leave room for the removal of the decomposition products of the cap-layer material. According to a second alternative comprised by the method of the invention, opening the covered trench from the second substrate side and allowing the cap-layer material to be removed through that opening provides a solution. Both alternatives comprised by the present invention are based on the common idea of using a temporary cap-layer even in a situation where the substrate opening is permanently covered before the removal of the temporary cap-layer. This is, according to both alternatives, achieved by providing a path for the removal of the decomposition products of the cap-layer material.

The decomposition and removal of the cap-layer material is effected by heating the substrate to a temperature above the threshold temperature. The physical mechanism governing the decomposition and removal of the sacrificial cap layer depends on the selected material. The decomposition takes place, for instance, by melting, or by sublimation. The removal can take place by evaporation, or by letting liquid decomposition products flow out of the trench or via hole, respectively. As a result of both aspects of the invention, the trench is kept permanently covered on the first substrate side and is at the same time cleaned from the decomposition products of the cap-layer material before the through-substrate via hole is filled with an electrically conductive material.

The method of the invention has the advantage of enabling the production of a through substrate via under an existing cover layer such as bond pads in a back-end processing stage. Additionally, passivation layers and the like can be provided on the substrate. This is important so as to enable the provision of an integrated circuit on the first side of the substrate, since the plurality of layers thereof is in need of an adequate passivation. This is alternatively important for the creation of RF capacitors, and tunable capacitors on the first side of the substrate, as such capacitors need a properly, uniformly deposited dielectric.

The method of the invention has further the advantage that the through-hole via can be combined with another trench, such as a trench capacitor, while nevertheless another material is used for the filling of the trench. In other words: while the trench capacitor can be filled with polysilicon, the through-substrate via can be filled with a better conductive alternative, such as copper, aluminium, tungsten or TiN, or an alloy or combination thereof.

The first substrate side is also referred to as the top side herein, and the second substrate side as the bottom side. It is understood that the method of the invention can be used to produce a plurality of covered through-substrate vias in a substrate at the same time.

Advantageously, an insulation layer is deposited on the first substrate side after the manufacture of the trench and before the provision of the cap layer, covering all inner faces of the substrate trench with the insulation layer, which is adapted to electrically isolate the substrate from the through-substrate via. Herewith an electrically insulated via is obtained that can be used for signal transmission.

The creation of an insulated via sets even further requirements to the processing, as manufacturing the via from the second side of the substrate after completion of the processing does not work adequately. First of all, it is not possible to provide a thermal oxide in the trench, after that the metallisation and other layers have been provided on the first side; the temperature needed for the creation of a thermal oxide would damage at least some of these layers considerably. If another insulator were deposited in the trench, the insulator would be deposited as well on the bottom of the trench. Therewith it would form an electrically insulating barrier. An insulating barrier of 2 or 3 nm suffices to get a tunnel contact—in which a voltage drop occurs—instead of a ohmic contact, as is required for instance for DC grounding and RF signal transmission. Etching of such insulator from the via is very difficult if not impossible, as there appears no method to remove the insulator from the bottom of the trench only. Additionally, the use of wet-etching leads thereto that fluid gets into the trench that tends to stay there due to capillary forces.

In the following, preferred embodiments of the method of the first aspect of the invention will be described. Unless explicitly introduced as alternative embodiments, different embodiments can be combined with each other.

In the method of the first alternative, the step of producing the overcoat layer preferably comprises depositing a porous material. A porous material can easily be manufactured and provides holes that can be used for evaporation of the cap-layer material.

In an alternative to that embodiment, the step of producing the overcoat layer comprises a step of depositing a continuous overcoat layer without holes, and a subsequent step of fabricating holes in the overcoat layer. Holes can be fabricated by patterning using photolithography. The overcoat layer can in this embodiment for instance be manufactured by depositing silicon dioxide or silicon nitride using a plasma-enhanced chemical vapor deposition (PECVD) technique. Alternative materials that can be used as an overcoat layer in this embodiments are polyamides, or metals.

An embodiment of the method of the first alternative, comprises, after the removal of the decomposition products of the sacrificial cap layer, the production of an electrically conductive cover layer on the overcoat layer. The cover layer is preferably used as a plating base to subsequently form a bond pad, such as a Cu bond pad.

The overcoat layer processing can be made simpler in the method of the second alternative. Here, the step of producing the overcoat layer preferably comprises depositing a metal layer, thereby forming an electrically conductive cover layer that covers the filling-material on the substrate trench. The cover layer preferably forms a plating base for a bond pad, which can be made of Cu. Thus, just one layer is needed to form a plating base for a bond bad.

A further embodiment of the invention comprises, before the step of producing an electrically conductive filling layer, a step of producing a diffusion barrier layer on the insulation layer, the diffusion barrier layer being adapted to prevent diffusion of filling layer material into the insulation layer or into substrate. The diffusion barrier layer preventing the diffusion of Cu can for instance be made of TaN, Ta, TiN, TiW, or other materials known in the art. The diffusion barrier can be deposited step-conformally by LPCVD in the substrate trench. If the insulation layer combines insulating and anti-diffusion properties for a given metal, an additional diffusion barrier is not necessary, but can still be provided if, for instance, the thickness of the insulation layer is not sufficient to completely block metal diffusion into the substrate. Preferably, the diffusion barrier material is selected such that it also can serve as a plating base for the electrically conductive filling layer.

It is noted that the filling layer in some will fill the diameter of the through-substrate via-hole, and in other embodiments will leave an empty room in the center of the via hole, depending on a particular application.

The cap-layer material that is used in the method of the invention is preferably a polymer. A listing of suitable thermally decomposable sacrificial materials is given in column 4, lines 15 to 30 of U.S. Pat. No. 6,833,320B2 in table form, and further suitable materials are given in lines 31 to 65. Other suitable materials for the sacrificial cap layer include PECVD oxide, PMMA (Polymethyl methacrylate, also known under its IUPAC name: methyl 2-methylpropanoate), metals, certain polyimides, or a material known as Unity 400 and offered commercially by the company "Promerus Electronic Materials", and other refractory materials. Upon heating above the respective threshold temperature, these materials cleanly decompose and can be removed without leaving any residues.

The cap-layer may be applied in a patterned manner by first depositing the material and then removing it so as to create the pattern. Alternatively, it could be applied in a patterned manner directly. Suitably techniques for depositing include spin-coating and spraying. With these techniques only a limited amount of the material of the cap layer will go into the trench. Printing, includes techniques as inkjet-printing and screen-printing, are suitable for a patterned deposition.

The removal of the sacrificial cap layer from the first substrate side at temperatures below the threshold temperature is preferably performed by plasma etching or chemical mechanical polishing the cap layer from the first substrate side. Even the etching may be carried out maskless, as the cap layer will also be present in the trench, and not just on top of the trench. After the removal step the first substrate side is preferably essentially flat and without holes or trenches.

The provision of the insulation layer in the trench directly after the etching of the trench has the procedural advantage that it can be used as an etch stop layer during the opening of the trench from the second substrate side during the formation of the through-substrate via hole. In particular, the step of opening the trench from the second substrate side preferably comprises:

a coarse removing step, in which substrate material is removed from the second substrate side except for an intermediate layer of substrate material left underneath the trench, a fine removing step, in which the intermediate layer under the trench is removed by etching, using the insulating layer on the bottom face of the trench as an etch-stop layer an unsealing step, in which the insulating material forming the bottom face of the trench is selectively etched away to open the trench. This way, a very precise processing of the through-substrate via hole is made possible.

According to a second aspect of the invention, a method is provided for producing an electronic device comprising a substrate with an electronic circuit element electrically connected with at least one through-substrate via that electrically connects a first substrate side with an opposite second substrate side, the method of the first aspect of the invention is performed for producing the at least one covered through-substrate via, and at least one layer of the electronic circuit element is provided on the first substrate side after the provision of the overcoat layer and before the opening of the substrate trench from the second side of the substrate.

The method of the second aspect of the invention provides an advantageous integration of the method for forming a covered through-substrate via according to the first aspect of the invention into existing process technology. The at least one layer deposited afterwards suitably includes an insulating layer deposited with PECVD, such as a passivation layer or a dielectric for an RF capacitor. Preferably, the at least one layer includes an interconnect structure for connecting the electrical elements in the substrate and any electrical elements in devices to be assembled to the substrate. Therewith, the circuit on the first side is an integrated circuit comprising a plurality of mutually interconnected passive and/or active electrical elements.

In one embodiment, the step of producing at least one layer of the electronic circuit element comprises providing a layer of a layer structure in a trench, the layer structure comprising a sequence of a dielectric layer and an electrically conductive layer. More particularly, it is preferred that this trench is made simultaneously with the trench for the through-substrate via. After the deposition of the cap-layer, the one trench may then be filled to create the element. Suitable elements in trenches include trench capacitors, trench batteries, trench transistors. In the generation of a trench capacitor it is suitable that the step of producing an insulation layer in the method of the first aspect of the invention is concurrently performed with the provision of at least part of the dielectric layer of the layer structure in the trench.

According to a third aspect of the invention, an electronic device is provided comprising a semiconductor substrate that has a first substrate side and an opposite second substrate side, and a circuit of electrical elements electrically communicating with a through-substrate via, which is covered with an inorganic passivation layer. This via extends from the first substrate side to the second substrate side and comprises an electrically conducting material allowing a substantially ohmic connection. It is provided with an insulation layer that extends from the first substrate side to the second substrate side and shares a first interface with the substrate and that is adapted to electrically isolate the electrically conductive material from the substrate.

The device of the invention comprises not merely a single electronic circuit element, but a circuit of electrical elements on its first side. The presence of a passivation layer allows the provision of far more complex circuits. Due to the ability to provide contacts both on its top side and on its bottom side it contributes to the stacking of integrated circuits.

And the use of an electrically conducting material allowing a substantially ohmic connection in the via allows good connections that are suitable for signal transmission. Such materials include in particular metals, alloys and conducting nitrides, while not including polysilicon. Cu for instance has a resistance of about 2 μΩcm, TiN about 100 μΩcm, but highly doped polysilicon at best about 1000 μΩcm. Most suitably are evidently metals and alloys.

One clear advantage of the use of vias through the semiconductor substrate as opposed to conductors in the package, is that the effective length of vias through the semiconductor substrate is much shorter. It is observed herein that not all vias need to be connected to the circuit at the first side of the substrate; some of them may be connected directly to an electronic device assembled on the first side of the substrate. For this purpose, it is advantageous if bond pads are present on top of a through-hole via.

Another advantage of the invention is that the vias may be arranged to constitute a coaxial connection. A via carrying a signal line is herein surrounded by vias carrying ground connections. Such coaxial connection is therewith an example of a stripline that has reduced resistance particularly at higher frequencies.

In a suitable embodiment, the through-substrate via comprises a first and a second electrically conductive layer along an axis through the via, said layers having a mutual interface, which second layer extends to the second side of the substrate and comprises a metal or alloy. This displacement of the interface to a position inside the via, and not coplanar with the first substrate side, may be a result of the provision and processing of the cap layer. It has the additional advantage that there is a well-defined end of the trench after the removal of the cap-layer. This is useful for the provision of the electrically conductive material from the second side. Also, the interface between the conductive layer and the substrate on the first substrate side does not get exposed, and cannot be damaged. An additional advantage may be that the adhesion is improved, as the interface in the trench tends to be larger than an interface coplanar with the first side of the substrate.

It is suitable for the mechanical constitution of the circuit that also the via is covered with one or more cover layers. Effectively, the processing according to the method of the invention allows and foresees that the via is covered.

It is preferred that bond pads are provided on the via. The bond pads may be present directly on the substrate, but is alternatively present at a distance from the substrate, with a vertical interconnect extending between the bond pad and the through-substrate via.

The semiconductor substrate is suitably a monocrystalline substrate of silicon. It may be provided with an amorphous top layer. In case that the substrate comprises a network of integrated passives suitable for use in RF applications, the substrate is preferably high-ohmic, e.g. with a resistance of a kΩcm or more such as known per se. It is not excluded that the semiconductor substrate comprises a buried insulating layer. It is neither excluded that the semiconductor substrate comprises another material that silicon, or comprises a layer of another material. Examples include SiC, SiGe, GaN or any other III-V material in general.

Any further embodiments mentioned above with reference to the first and second embodiment are also applicable to this third embodiment.

According to a fourth aspect of the invention, an electronic device is provided comprising a semiconductor substrate that has a first substrate side and an opposite second substrate side, and an electronic circuit element electrically communicating with a through-substrate via. This via extends from the first substrate side to the second substrate side and comprises a metal. It is provided with an insulation layer that extends from the first substrate side to the second substrate side and shares a first interface with the substrate and that is adapted to electrically isolate the electrically conductive material from the substrate, wherein the electronic circuit element is a capacitor with a PECVD deposited dielectric layer.

As will be clear from above, the invention resides therein that layers may be deposited on the first side of the substrate that need to be deposited at temperatures that would lead to stress in the substrate when metal vias are present therein. Such layers are particularly PECVD dielectric layers, which are advantageous in view of their uniformity. This uniformity contributes to a good control of the capacitance and it leads to a higher breakdown voltage. Any embodiments mentioned with reference to the third aspect or the first or second method are also applicable to this fourth aspect of the invention.

According to a fifth aspect of the invention, an electronic device is provided comprising a semiconductor substrate that has a first substrate side and an opposite second substrate side, and an electronic circuit element electrically communicating with a through-substrate via. This via extends from the first substrate side to the second substrate side and comprises a metal. It is provided with an insulation layer that extends from the first substrate side to the second substrate side and shares a first interface with the substrate and that is adapted to electrically isolate the electrically conductive material from the substrate, wherein the electronic circuit element is a trench element that comprises at least one layer that is not present in the through-substrate via.

As will be clear from above, the invention resides therein that elements and layers may be created that layers may be deposited on the first side of the substrate that need processing that is incompatible with the processing of the through-hole via. Such an element is a trench element, which comprises at least one layer that is not present in the through-hole substrate. Specific examples hereof are trench capacitors and trench batteries. In a trench capacitor, the dielectric may be the same as the insulation in the via. It is however preferred to use polysilicon as the top layer, for instance because the diameter of the trench in the capacitor is much smaller. It is even more preferred to provide a stacked trench capacitor, and the provision of all such layers as well in the via tends to be unhandy. The material needed for a battery is evidently not desired in a through-substrate via.

Any embodiments mentioned with reference to the third aspect or the first or second method are also applicable to this fifth aspect of the invention.

In the following, preferred embodiments will be described with reference to the enclosed Figures.

FIGS. 1a)-p) show different stages during a process of producing a substrate with an electrical through-substrate via according to a first embodiment of the invention.

FIGS. 2a)-n) show different stages in the processing of a substrate with an electrical through-substrate via according to a second embodiment of the invention.

FIGS. 3a)-p) show different stages in the processing of an electronic device with electrical circuit elements on a first substrate side and an electrical through-substrate via connecting the first substrate side with the opposite second substrate side.

For purposes of clarity of graphical representation, the following description is limited to examples of a substrate with only one via. However, it is understood that the described process can also be used for the formation of a multitude of vias in one substrate. The vias may be arranged at predetermined positions in the form of a via array.

For the purpose of the present description it will be also be assumed that the substrate used in the process is a silicon wafer. It is understood that other semiconducting materials can be used for forming the substrate without having to deviate from the processing described here. The use of silicon-on-insulator (SOI) substrates is also possible.

Turning now to the first example, FIGS. 1a)-p) show different stages of a process of producing a substrate with an electrical via according to a first embodiment. In the present embodiment, a substrate wafer 100, which is shown in the initial stage in FIG. 1a), is used as a starting material.

The wafer 100 has two opposite sides 102 and 104. In the present embodiment the first side 102 will also be referred to as the top side, and the second side 104 will also be referred to as the bottom side.

In a first processing step a passivation layer 106 is applied to the top side 102 of wafer 100 (FIG. 1b). The passivation layer serves to protect the top side of the wafer from undesired chemical reactions and contaminations during the following processing steps.

As shown in FIGS. 1c) and d), the passivation layer 106 is then partly and selectively removed to form a processing window 108 at a desired position for producing a via. Subsequently, the substrate is selectively removed in processing window 108 to form a trench 110. The trench 110 can for instance be formed by etching, powder blasting, laser drilling, or micro drilling.

In a next step, the result of which is shown in FIG. 1e), an insulating layer 112 is applied on the wafer and in the trench 110. The insulation layer 112 covers the passivation layer 106 and side faces 114, 116, as well as bottom face 118 of trench 110. The insulating layer can for instance be applied by low-pressure chemical vapor deposition (LPCVD) of silicon dioxide. A suitable precursor for this insulating-layer material is tetraethyl orthosilicate (TEOS).

Subsequently, as shown in FIG. 1f), a sacrificial cap layer 120 is deposited on the top side 102 of wafer 100. The cap layer is made of a material, which is thermally stable below a threshold temperature, and decomposes at temperatures higher than the threshold temperature. A listing of suitable thermally decomposable cap-layer materials is given in column 4, lines 15 to 30 of U.S. Pat. No. 6,833,320B2 in table form, and further suitable materials are given in lines 31 to 65 of that document. Other suitable materials for the sacrificial cap layer include PECVD oxide, metals, or a material known under the trademark "Unity 400" and offered commercially by Promerus Electronic Materials. In one embodiment the cap-layer material is photosensitive. This enables easy patterning of the cap layer in following processing steps.

For the present example it is assumed that the cap layer 120 is made of a suitable polymer. As can be seen form FIG. 1f), the temporary cap layer 120 partially fills the trench 110. Depending on the chosen cap-layer material and processing conditions, the cap layer 120 can also completely fill the trench 110. This filling effect is desired because it allows to produce a substrate surface free of trenches or holes, thus avoiding a sagging of further materials, which are deposited on the top side 102 of substrate 100, into the trench 110.

However, it is not desirable to deposit further layers on the temporary cap layer 120 in those regions of the substrate 100, which are not selected for a trench formation. Therefore, the temporary cap layer 120 is in a next step removed from all regions except for the trenches, thereby keeping the top side 102 of substrate 100 free of holes and trenches for further processing. Only the partial or complete filling 120 of the trenches 110 remains, cf. FIG. 1g). The removal can be accomplished by plasma etching or chemical-mechanical polishing (CMP).

Subsequent steps are performed at a temperature below the decomposition threshold temperature of the cap-layer material 120, including, of course, the possibility of performing different steps at different temperatures below the threshold temperature.

First, an overcoat layer 122 is applied below threshold temperature (FIG. 1h). In the present embodiment, the material of the overcoat layer is an oxide or nitride layer deposited by plasma enhanced chemical vapor deposition (PECVD). A metal is also a suitable overcoat material.

The overcoat layer 122 is patterned, at a temperature below the threshold temperature, using photolithography, and provided with small holes 124 (FIG. 1k)). FIG. 1k) only schematically shows the provision of holes in overcoat layer 122. The number of holes and their size is chosen so as to allow decomposed cap-layer material to be removed through the holes.

In a next step, the processing temperature is increased to a value above the decomposition threshold temperature in order to let the sacrificial cap-layer decompose. For the purpose of the present embodiment, it is assumed that the decomposition products of the cap-layer material are removed by evaporation through the holes of overcoat layer 122. The substrate and other layers including overcoat layer 122 are stabile at the processing temperatures involved in the decomposition and thus remains after the decomposition and removal steps. The result of the decomposition and removal of the cap-layer material from the trench 110 is shown in FIG. 1l).

After removal of the polymer cap-layer material a plating base 126 is deposited on top of the insulating layer 112 and the patterned overcoat layer 122 on the top substrate side 102. The plating base is for instance a copper plating base (FIG. 1m)).

Subsequently, the wafer is grinded back from the bottom substrate side 104. The grinding represents a coarse removal step, at the end point of which there is still some substrate material underneath the trench. The intermediate state after this coarse removal step is not shown in FIG. 1. Rather, FIG. 1n) shows the substrate after a second, fine removal step, during which the remaining substrate material is removed until the insulating layer 118 at the bottom of the trench 110 is reached. Insulating layer 118 thus serves as an etch stop layer.

Subsequently, trench 110 is opened from the bottom side by removing the bottom phase 118 of the insulating layer 112.

For this, a selective etching step is performed. This will open trench 110, which then thus forms a through-substrate viahole, cf. FIG. 1o). The same reference number 110 is used herein to label the viahole and the original trench.

Next, a metal seed, or, in other words, plating base layer is deposited on the inner faces of via hole 110, followed by a step of applying a metal filling 128 in the via hole using galvanic copper plating or other known means of applying a metal, FIG. 1p).

The described process allows to form a covered electrically conductive through-substrate via, using a temporary cap layer, which is removed by evaporation through an overcoat layer 122. It should be noted that overcoat layer 122 can also be porous by itself. In that case there is no need for fabricating holes 124 in the overcoat layer at the trench sites. This allows simplifying the processing. A suitable porous overcoat material is for instance spin-on-glass.

FIGS. 2a)-n) show different stages in the processing of a substrate with an electrical via according to a second embodiment.

A substrate wafer 200 is used as a starting material, FIG. 2a). Wafer 200 has two opposite sides 202 and 204. In the present embodiment the first side 202 will also be referred to as the top side, and the second side 204 will also be referred to as the bottom side.

The initial processing is identical to that of the embodiment described with reference to FIG. 1. It will be summarized in the present paragraph. For processing details and alternatives, reference is made to the description of FIGS. 1a) through 1g). In a first processing step, a passivation layer 206 is applied to the top side 202 of wafer 200, FIG. 2b). As shown in FIGS. 2c) and d), the passivation layer 206 is then partly and selectively removed to form a processing window 208 for producing a via. Subsequently, the substrate is selectively removed in processing window 208 to form a trench 210. In a next step, the result, of which is shown in FIG. 2e), an insulating layer 212 is applied on the wafer and on the inner faces of trench 210. Insulation layer 212 covers passivation layer 206 and side faces 214, 216, as well as bottom phase 218 of trench 210. Subsequently, as shown in FIG. 2f) a sacrificial cap layer 220 is deposited on the top side 202 of wafer 200. Cap layer 220 is made of a polymer. The cap layer consists of a material, which is thermally stabile below a threshold temperature, and decomposes at temperatures higher than the threshold temperature. As can be seen from FIG. 2f), the temporary cap layer 220 partially fills the trench 210. This filling effect is desired because it allows to produce a substrate surface free of trenches or holes, that avoids a sagging of further materials, which are deposited on the top side of substrate 200, into the trench 210. Temporary cap layer 220 is in a next step removed from all regions except for the trenches, thereby keeping the top side 202 of substrate 200 free of holes and trenches for further processing. Only the partial or complete filling 220 of the trenches 210 remains, FIG. 2g).

Subsequent steps are performed at a temperature or, respectively, at temperatures below the decomposition temperature of the cap-layer material 220.

Figure 2:
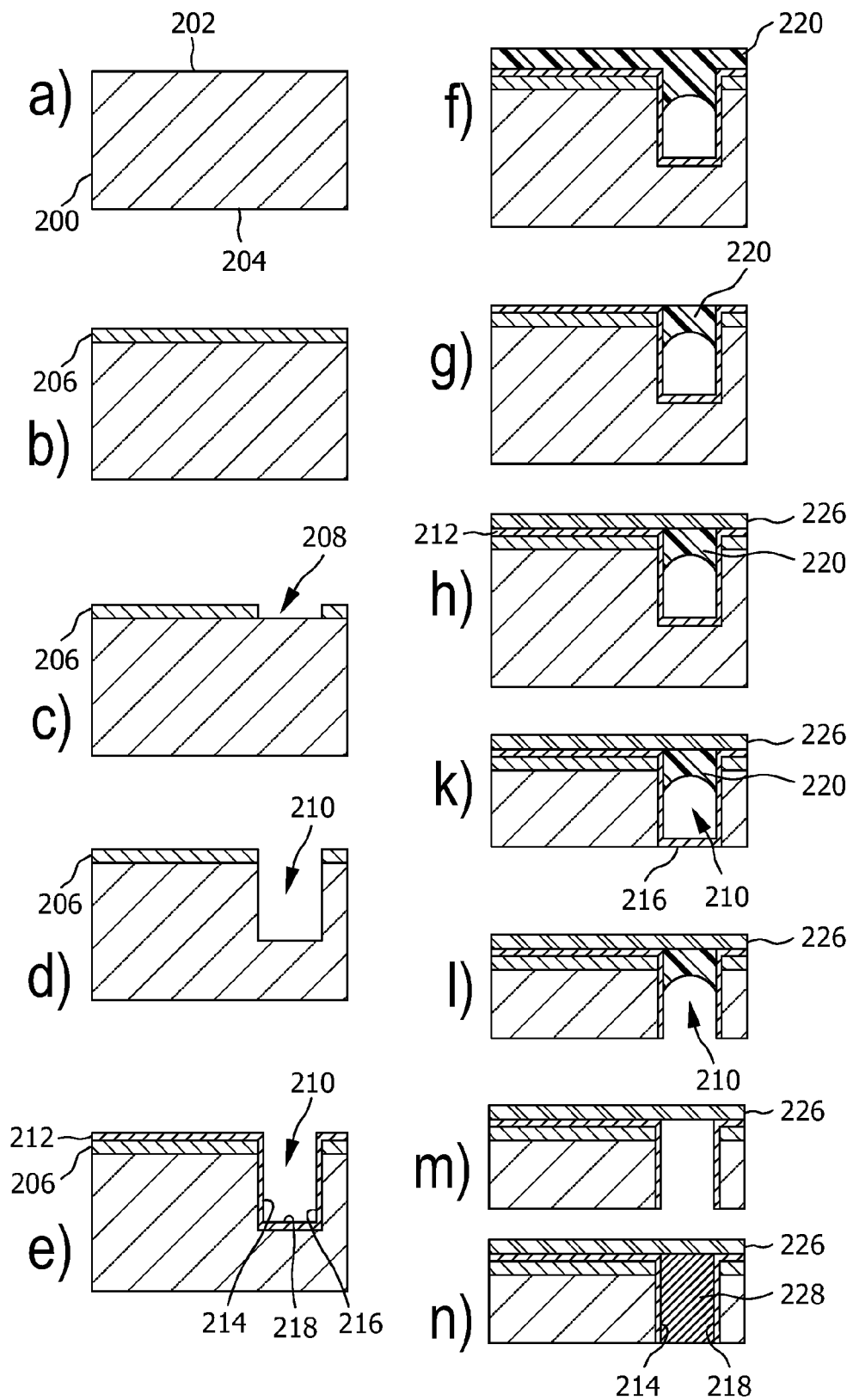

Unlike in the embodiment of FIG. 1, the present process continues with directly depositing, at a temperature below threshold temperature, a plating base layer 226 on top of the insulating layer 212 and the trenches, which are covered with cap-layer material 220. Subsequently, in a coarse removal step, again at a temperature below threshold, the wafer is grinded back from the bottom substrate side 204, leaving behind some of the substrate material for the next fine removal step. The intermediate state after this coarse removal step is again not shown in FIG. 2. FIG. 2k) shows the substrate after the fine removal step, during which the remaining substrate material is removed at a temperature below the threshold temperature, until the insulating layer 218 at the bottom of the trench 210 is reached. Insulating layer 218, like in the embodiment of FIG. 1, serves as an etch stop layer.

Subsequently, trench 210 is opened from the bottom side by removing, at a temperature below threshold temperature, the bottom phase 218 of the insulating layer 212. For this, a selective etching step is performed. This will open trench 210, which thus forms a through-substrate via hole, cf. FIG. 2l).

Next, the cap-layer material 220 is removed from trench 210 by heating the substrate to a temperature above the threshold temperature for decomposition. The cap-layer material is removed through the opening of trench 210 on the bottom side 204 of trench 210. In the present embodiment cf. FIG. 2m), both liquid and gaseous decomposition products can be removed easily due to the larger diameter of the trench opening, as compared with the hole formed in overcoat layer 122 in the embodiment of FIG. 1.

Next, a metal seed (plating base) layer is deposited on the inner faces of via hole 210, followed by a step of applying a metal filling 228 in the via hole using galvanic copper plating or other known means of applying a metal, FIG. 2n).

The above described embodiments allow the realization of so-called fine vias. Fine vias are for instance required for the realization of next-generation RF-SiP modules. The characteristic via hole width of a fine via in the order of around 5 μm to 50 μm. The fine vias serve for heat dissipation of the chips in a SiP and, in addition, to carry electrical signals. Therefore, the provision of insulating layer sections 114, 116, 118, and 214, 216, 218, respectively, is required between the metal in the via and the substrate. The insulating layers 112, 212 should be compatible with silicon technology, have a good step coverage, and provide a diffusion barrier to prevent metal diffusion into the substrate. Of course, they should have good electrical insulating properties. Typical examples of suitable insulating materials are thermal oxides, deposited oxides or nitride layers. Alternatively or after the insulation layer deposition an extra diffusion barrier layer can be applied before the actual metal layer, such as LPCVD grown TaN, TiN, etc., that in the ideal case can also serve as a plating base for the metal layer.

Clearly, the requirements for the via filling material 128, 228 in this case are to provide a low thermal and electrical resistivity. In addition, the material should be suitable to prevent undesired signal loss. In case of an integration into standard silicon process technology like known CMOS processing technology, the metal should be compatible with this technology. Typical examples of a suitable metal filling material are copper, silver, and gold, and aluminum.

The methods described herein enable a three-dimensional integration, i.e. a stacking of dies, for which the provision of through wafer vias is required. The described processes are also useful in providing three dimensional access, for instance when using microfluidic cooling interconnects.

Note, that in the present embodiment the electrically conductive filling layer provides a complete filling of the lateral extension of the through-substrate via. In an alternate embodiment, the filling layer has a shape of a circular elliptical or oval ring, as seen in a cross-sectional view of a plane parallel to the first and second substrate sides. In this alternative embodiment, the centre of the via may remain empty to form a "coaxial" type of a filling, or be filled with another layer.

FIGS. 3a)-p) show different stages in the processing of an electronic device with electrical circuit elements on a first substrate side 300 and an electrical through-substrate via connecting the first substrate side with the opposite second substrate side.

The general processing scheme resembles that shown in FIGS. 1*a*) through 1*p*). However, in contrast to that, in the present embodiment the concurrent production of three circuit elements on a top substrate side 300 is shown: a planar capacitor 302, a trench capacitor 304 and a resistor 306. Instead of a trench capacitor, an inverse structure in the form of a pillar can be used (not shown), which is hereinafter referred to as a pillar capacitor. For pillar capacitors, instead of using pore or trench structures, which are at least size limited in one of the two directions of the space, the image of structures is reversed, that is vertical pillars are formed instead of vertical holes.

Functional layers of these circuit elements are produced prior to the production of a through-substrate via, as will be explained in the following with reference to FIG. 3*a*). Note, that these circuit elements are shown in the arrangement of FIGS. 3*a*)-3*n*) merely by way of example in order to explain the order of processing in the production of these devices in relation to the production of a through-substrate via.

The planar capacitor 300 is formed on top of a first doped surface region 308 of substrate 310, which in the present example is a high-resistivity silicon substrate. A first oxide-nitride-oxide (ONO) layer structure 312 forms a dielectric layer between the doped region 308 and a first polysilicon layer 314. First doped surface region 308 and first polysilicon layer 314 form two electrodes of planar capacitor 300.

A second doped surface region 316 is formed in the substrate at the position of trench capacitor 304, which for simplicity is shown to have a double-trench structure 318, 320 (or inversely: a single-pillar structure) in the cross-sectional view of FIG. 3*a*). The second doped surface region 316 is also formed at the interface between the substrate and the double-trench structure 318, 320 (or inversely: a single-pillar structure), sharing an interface with a second ONO-dielectric layer structure 322, which can be deposited on substrate 310 concurrently with first ONO-layer structure 312 of planar capacitor 300. Trenches 318, 320 are filled with a second polysilicon or filling layer 324, which can be deposited concurrently with first polysilicon layer 314 of planar capacitor 300. Second doped surface region 316 and filling layer 324 form two electrodes of trench (or inversely: a single-pillar structure) capacitor 304.

Resistor 306 comprises a third polysilicon layer 326 on top of a third ONO layer structure 328. The first, second and third polysilicon layers, which all form functional layers of their respective electronic circuit elements, are electrically conductive. The resistivity of these layers may be individually adjusted by incorporating dopant atoms with appropriate concentration levels inside the layers.

FIG. 3*b*) shows substrate 310 after formation of a trench 330 at the desired position of the through-substrate via hole, and deposition of an oxide layer 332 on top of all circuit elements 302, 304, and 306, as well as on all inner faces of trench 330. Oxide layer 332 forms the insulation layer of the through-substrate via, and the oxide deposition step thus corresponds to that performed to reach the stage of FIG. 1*e*) in the previously described first embodiment. However, as can be seen, the oxide layer deposition is useful also for the other circuit elements on substrate 310, where oxide layer 332 takes the function of an interlevel dielectric layer.

FIG. 3*c*) shows substrate 310 in a subsequent stage after deposition of a sacrificial PMMA cap layer 334. Details of this step have been described earlier with reference to the embodiments of FIGS. 1 and 2.

Next, as can be seen in FIG. 3*d*), PMMA cap layer 334 is removed in substrate portions other than trench 330, which remains partially filled. For suitable removal techniques, reference is made to the description of FIG. 1*g*). As a result, a smooth substrate surface is provided for subsequent layer deposition steps, despite the presence of trench 330.

In a following processing stage that is shown in FIG. 3*e*), a Plox (Plasma-enhanced deposited oxide) layer 336 is deposited on substrate 310, covering the circuit elements as well as trench 330. Plasma-enhanced deposited oxide layer 336 is selectively removed from surface sections other than that of trench 330, FIG. 3*f*).

A contact layer 338 is selectively deposited and structured to form contact elements in the region of circuit elements 302 through 306, see FIG. 3*g*) followed by a second oxide layer 340, which is formed on top of Plasma-enhanced deposited oxide layer 336 in the desired region of the through-substrate via 310. Next, holes 342 are formed in the Plox/second oxide layer structure 336, 340, FIG. 3*h*), and sacrificial PMMA cap layer 334 is decomposed and removed by evaporation through holes 342, FIG. 3*k*). A copper plating 344 is then applied on the substrate, covering the trench region 310 as well as circuit elements 302 through 306. In the next stages, shown in FIGS. 3*n*) through 3*p*), the through-substrate via is formed in a way identical to that explained with reference to FIGS. 1*n*) through 1*p*), i.e., by thinning the substrate from bottom side 346, opening trench 330 using oxide layer 332 as an etch stop layer in an intermediate step, and filling the trench 330, that has now become a through-substrate via 348, with a copper filling 350, for instance by plating, according to processes known in the art.

Note, that in an example that does not employ oxide layer 332 in trench 330, for instance in the formation of a thermal via, the opening step can be performed without the etch-stop technique described above. Instead, etching can be performed with precise timing to open the substrate from bottom side 346 without wasting substrate material.

Figure 3:
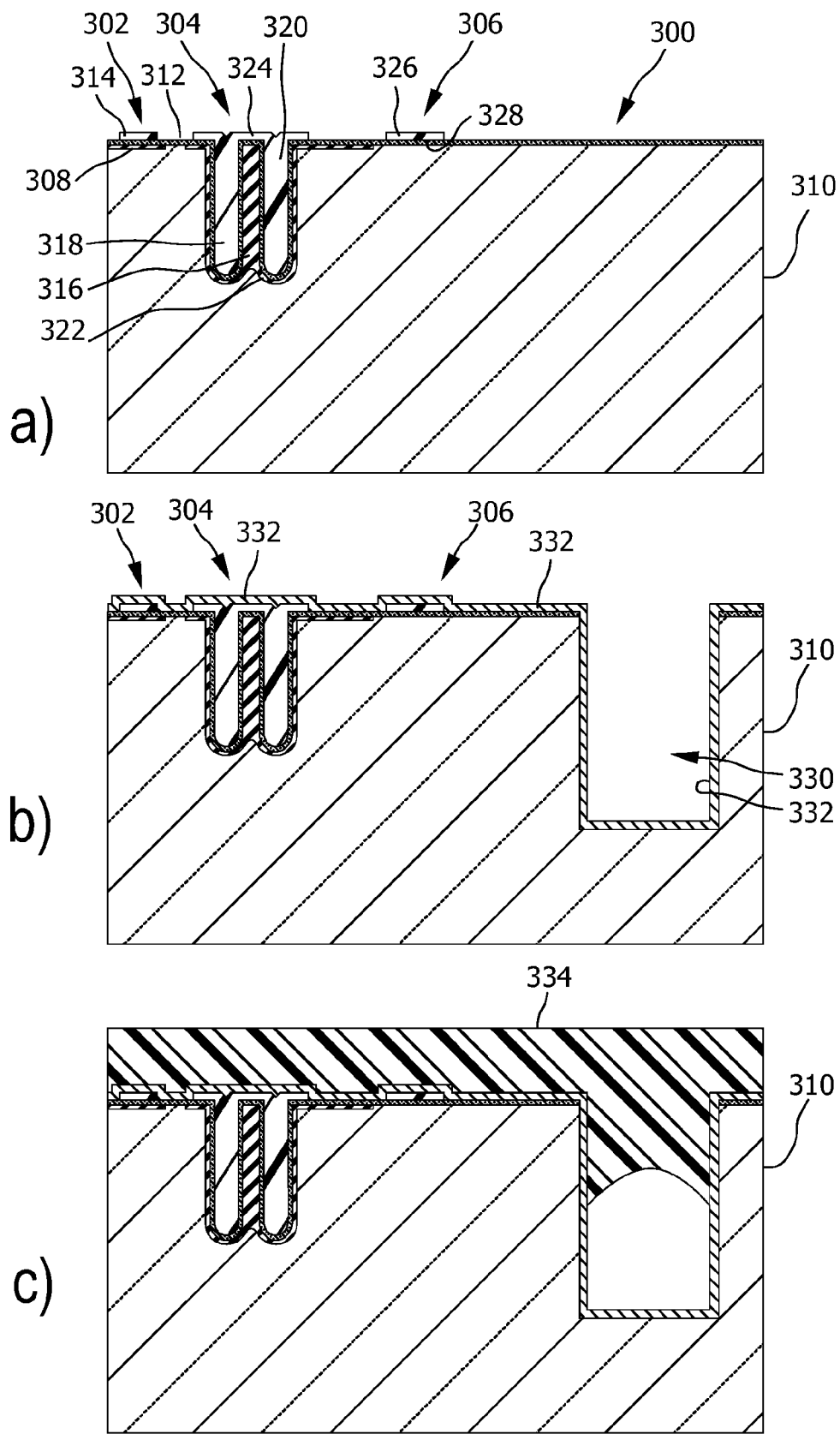
Figure 3:
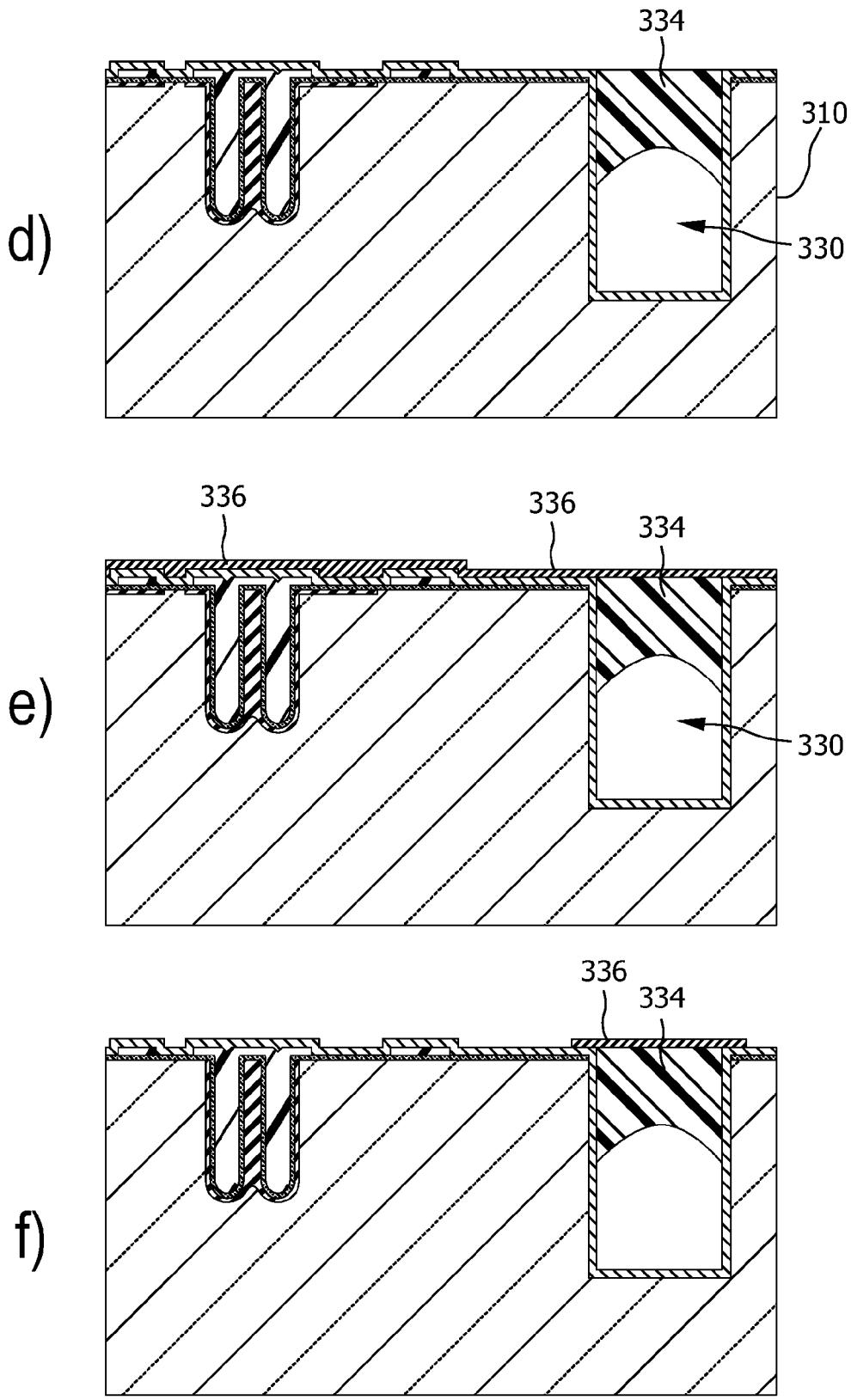
Figure 3:
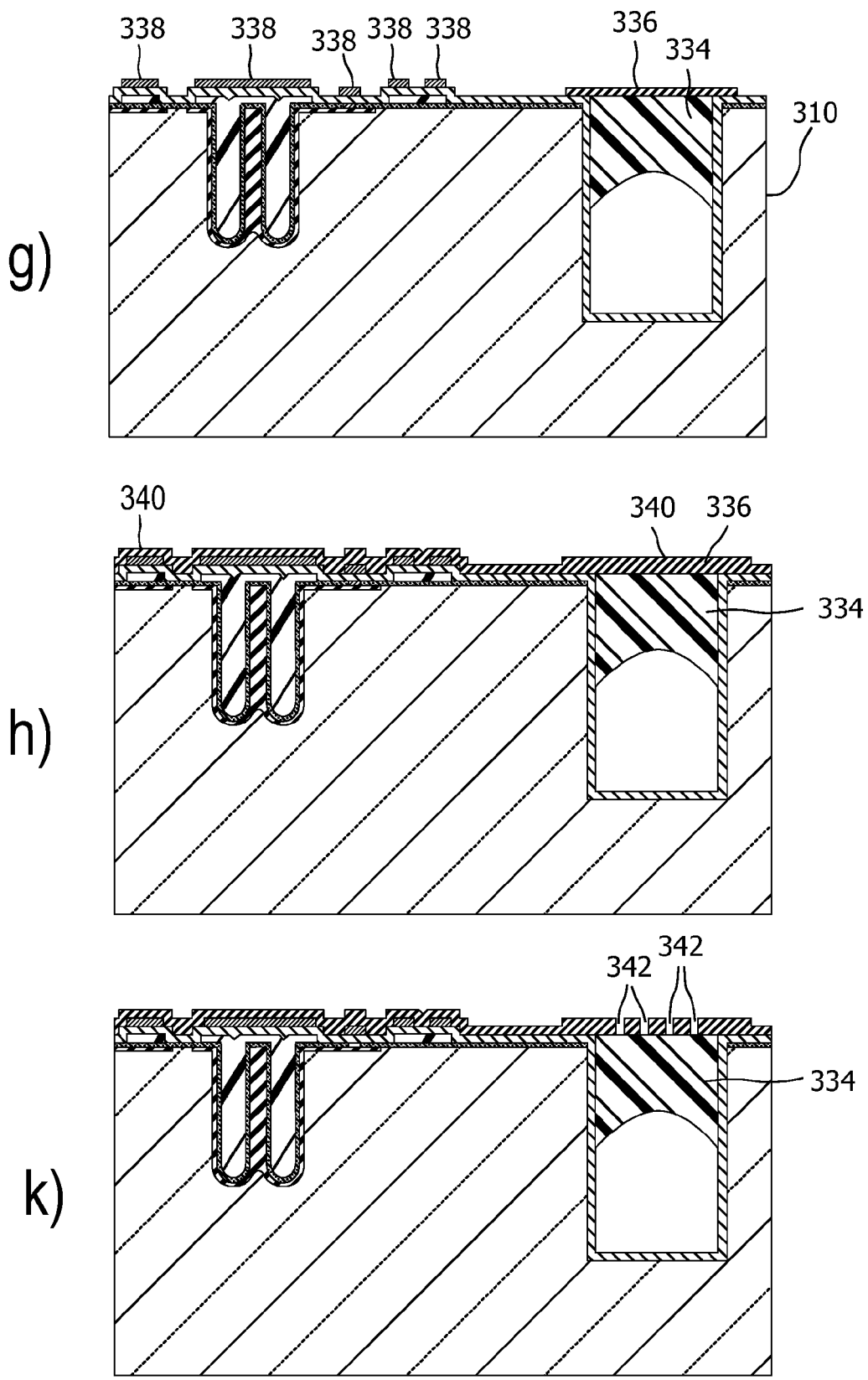
Figure 3:
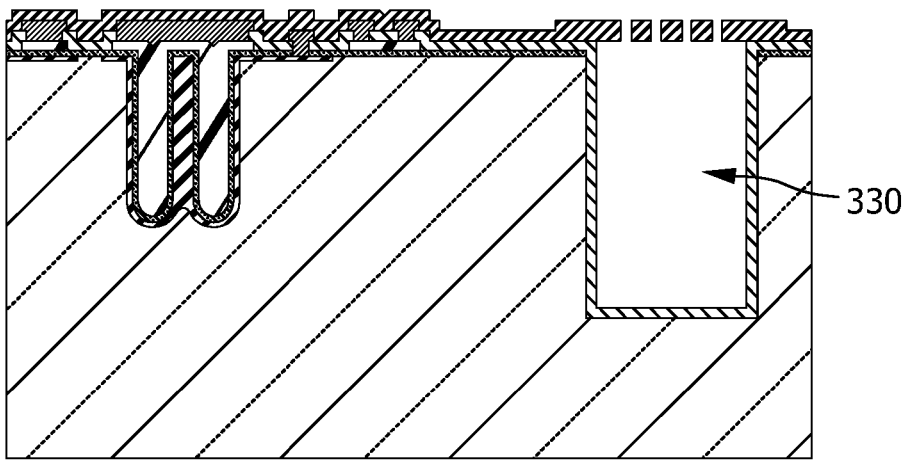
Figure 3:
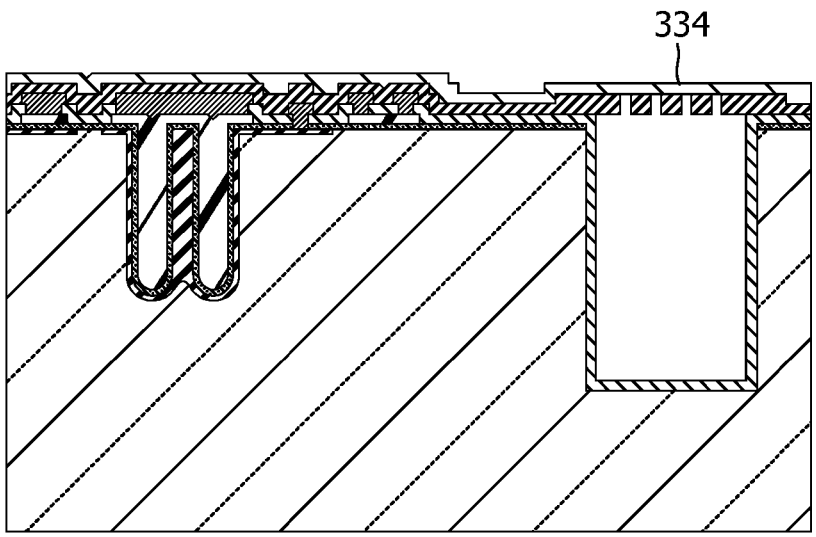
Figure 3:
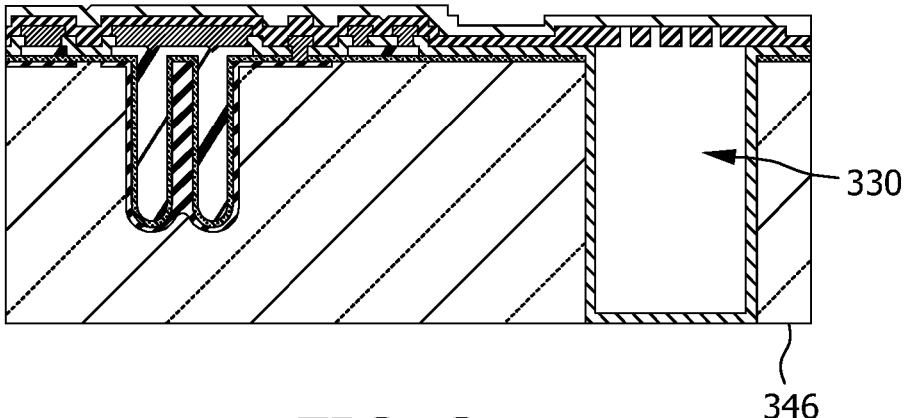
Figure 3:
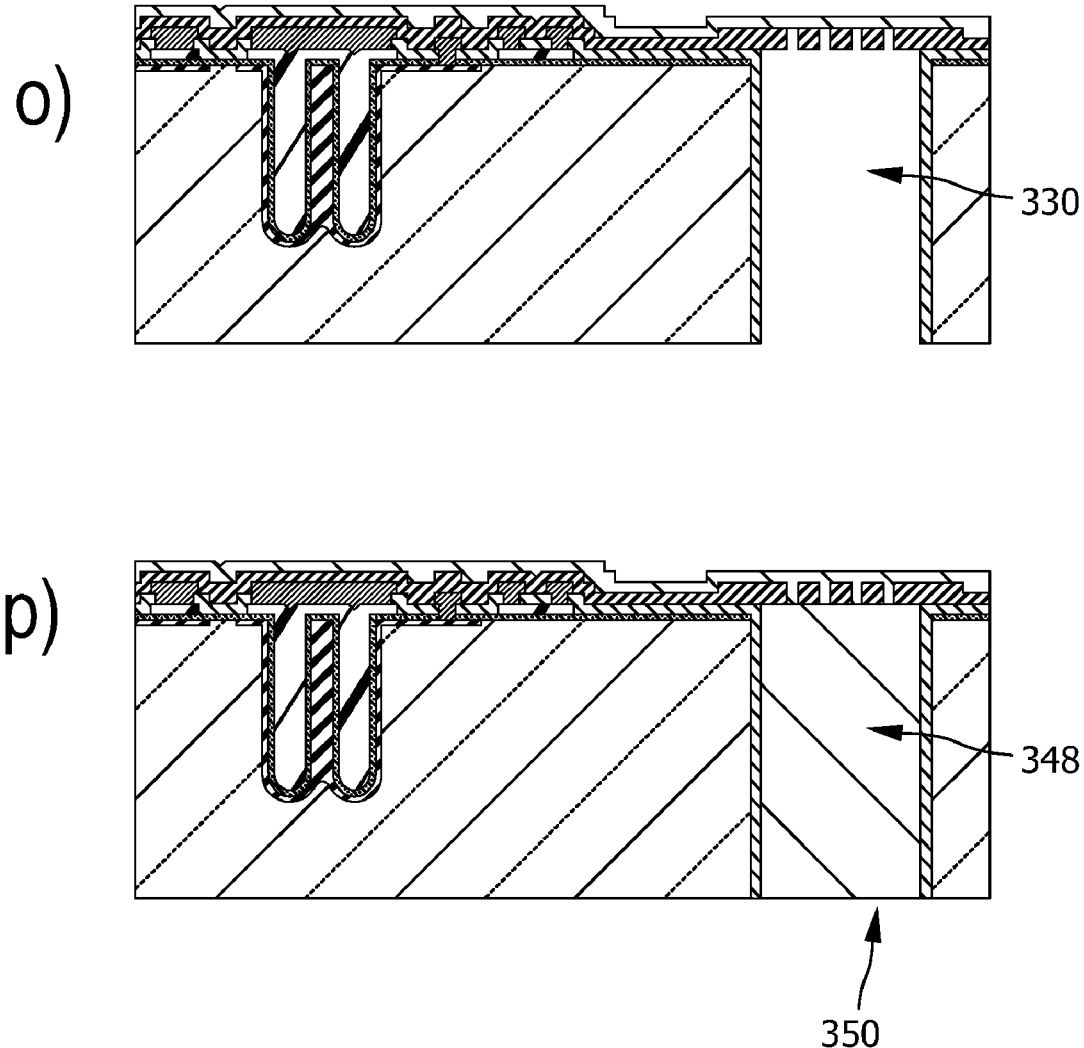

The example of FIG. 3 describes the realization of through vias after completing the formation and filling of trenches 318, 320 of trench (or inversely: pillar) capacitor 304. One could also think of making trench (or inversely: pillar) capacitor 304 after the through-substrate via 330, but then high-temperature processing steps would have to be used and device reliability issues might occur. Another option, simultaneous processing of trenches (or inversely: pillars) and vias, is difficult, since different depths should be etched in one step for trench (or inversely: pillar) capacitor 304 and for trench 330. Separating the etching of the trench (or inversely: pillar) and the via is not preferred. Another difficulty in simultaneous processing are the different requirements on the filling layers of the trenches (or inversely: pillars) of capacitor 304 and trench 330 with respect to capacitive coupling, which are very difficult to realize simultaneously.

The invention claimed is:

1. A method for producing a semiconductor substrate with a through-substrate via that electrically connects a first side of the semiconductor substrate with an opposite second side of the semiconductor substrate, the method comprising the steps of:

producing a substrate trench on the first side of the semiconductor substrate at a predetermined position of the through-substrate via;

applying a sacrificial cap layer consisting of a cap-layer material on the first side of the semiconductor substrate in a patterned manner, thereby completely covering and at least partially filling the substrate trench with the cap-layer material, and providing an overcoat layer that covers the sacrificial cap layer on the substrate trench, wherein the overcoat layer is provided with holes through which decomposition products of the sacrificial cap layer are removed;

opening the substrate trench from the second side of the semiconductor substrate to transform the substrate trench into a through-substrate via hole;

letting the sacrificial cap layer decompose;

removing all decomposition products of the sacrificial cap layer; and applying electrically conductive material in the substrate trench from the second side of the semiconductor substrate so as to provide the through-substrate via hole that extends to the second side of the semiconductor substrate.

2. The method of claim 1, wherein an insulation layer is deposited on the first side of the semiconductor substrate before the application of the sacrificial cap layer, wherein the insulation layer covers all inner faces of the substrate trench and electrically isolates the semiconductor substrate from the through-substrate via hole.

3. The method as claimed in claim 1, wherein the electrically conductive material in the substrate trench comprises a metal or an alloy.

4. The method as claimed in claim 1, wherein the overcoat layer is a porous layer.

5. The method as claimed in claim 1, further comprising:
opening the substrate trench only after the removal of all of the decomposition products.

6. The method as claimed in claim 1, further comprising:
opening the substrate trench from the second side of the semiconductor substrate prior to the decomposition of the sacrificial cap layer; and
removing the decomposition products through an open end of the through-substrate via hole on the second side of the semiconductor substrate.

7. The method of claim 1, further comprising:
after the removal of the decomposition products of the sacrificial cap layer, producing an electrically conductive cover layer on the overcoat layer.

8. The method of claim 6, wherein the step of providing the overcoat layer further comprises:
depositing a metal layer, thereby forming an electrically conductive cover layer that covers the substrate trench.

9. The method of claim 2, further comprising:
before the step of applying electrically conductive material in the substrate trench, a step of producing a diffusion barrier layer on the insulation layer, the diffusion barrier layer preventing diffusion of electrically conductive material into the insulation layer or into the semiconductor substrate.

10. The method of claim 1, wherein the step of applying the sacrificial cap layer in a patterned manner further comprises:
depositing the sacrificial cap layer material onto the first side of the semiconductor substrate; and
removing the sacrificial cap layer masklessly.

11. The method of claim 1, wherein deposition of an insulating layer with PECVD precedes the removal of the cap layer.

12. The method of claim 11, wherein the insulating layer is a passivation layer.

13. The method of claim 1, wherein the sacrificial cap layer is thermally stable below a threshold temperature that is higher than 300° C. and lower than 450° C.

14. The method of claim 1, further comprising:
providing at least one layer of an electronic circuit element on the first side of the semiconductor substrate after the provision of the overcoat layer and before the opening of the substrate trench from the second side of the semiconductor substrate, wherein the electronic circuit element is electrically connected with the through-substrate via.

15. The method of claim 14, further comprising:
providing a layer of a layer structure in the substrate trench, the layer structure comprising a sequence of a dielectric layer and an electrically conductive layer.

16. The method of claim 15, further comprising:
producing an insulation layer concurrently with the provision of the dielectric layer of the layer structure in the substrate trench.

17. An electronic device comprising:
a semiconductor substrate that has a first substrate side and an opposite second substrate side, and
at least one electrical element electrically communicating with a through-substrate via, which extends from the first substrate side to the second substrate side and comprises:
an electrically conducting material allowing a substantially ohmic connection, and
an insulation layer that extends from the first substrate side to the second substrate side that shares a first interface with the semiconductor substrate and electrically isolates the electrically conductive material from the semiconductor substrate; and
an overcoat layer, wherein the overcoat layer is provided with holes through which decomposition products are removed.

18. The electronic device of claim 17, wherein the through-substrate via comprises a first and a second electrically conductive layer along an axis through the through-substrate via, said first and second electrically conductive layers having a mutual interface, wherein the second electrically conductive layer extends to the second substrate side and comprises a metal or an alloy.

19. The electronic device of claim 17, wherein a further electronic device is assembled to the first substrate side and at least the through-substrate via provides a direct connection to the further electronic device.

20. The electronic device of claim 17, wherein there are a plurality of the through-hole vias present and the through-hole vias are arranged as a coaxial stripline.

21. The electronic device of claim 17, wherein a bond pad is provided on top of the through-substrate via.

22. A method for producing a semiconductor substrate with a through-substrate via that electrically connects a first side of the semiconductor substrate with an opposite second side of the semiconductor substrate, the method comprising:
producing a substrate trench on the first substrate side at a predetermined position of the through-substrate via;
applying a sacrificial cap layer consisting of a cap-layer material on the first side of the semiconductor substrate in a patterned manner, thereby completely covering and at least partially filling the substrate trench with the cap-layer material, and
providing an overcoat layer that covers the sacrificial cap layer on the substrate trench;
opening the substrate trench from the second side of the semiconductor substrate prior to the decomposition of the sacrificial cap layer;
removing all decomposition products of the sacrificial cap layer through an open end of the through-substrate via hole on the second side of the semiconductor substrate, and applying electrically conductive material in the substrate trench from the second side of the semiconductor substrate so as to provide the through-substrate via hole that extends to the second side of the semiconductor substrate.

23. A method for producing a semiconductor substrate with a through-substrate via that electrically connects a first side of the semiconductor substrate with an opposite second side of the semiconductor substrate, the method comprising:

producing a substrate trench on the first substrate side at a predetermined position of the through-substrate via;

applying a sacrificial cap layer consisting of a cap-layer material on the first side of the semiconductor substrate in a patterned manner, thereby completely covering and at least partially filling the substrate trench with the cap-layer material, and providing an overcoat layer that covers the sacrificial cap layer on the substrate trench;

providing at least one layer of an electronic circuit element on the first side of the semiconductor substrate after the provision of the overcoat layer and before the opening of the substrate trench from the second side of the semiconductor substrate, wherein the electronic circuit element is electrically connected with the through-substrate via;

letting the sacrificial cap layer decompose;

removing all decomposition products of the sacrificial cap layer, and applying electrically conductive material in the substrate trench from the second side of the semiconductor substrate so as to provide the through-substrate via hole that extends to the second side of the semiconductor substrate.

24. The device of claim 17, wherein a substrate trench is opened from the second side of the semiconductor substrate to transform the substrate trench into a through-substrate via hole.

25. The device of claim 17, wherein at least one layer of an electronic circuit element is provided on the first side of the semiconductor substrate.

26. The method of claim 22, further comprising:

after the provision of the overcoat layer, providing at least one layer of an electronic circuit element on the first side of the semiconductor substrate.

\* \* \* \* \*